United States Patent
Park et al.

(10) Patent No.: US 8,120,015 B2
(45) Date of Patent: Feb. 21, 2012

(54) RESONANT STRUCTURE COMPRISING WIRE AND RESONANT TUNNELING TRANSISTOR

(75) Inventors: Yun-Kwon Park, Dungducheon-Si (KR); Sung-Woo Hwang, Seoul (KR); Jea-Shik Shin, Hwaseong-Si (KR); Byeoung-Ju Ha, Seongnam-Si (KR); Jae-Sung Rieh, Seoul (KR); In-Sang Song, Seoul (KR); Yong-Kyu Kim, Seoul (KR); Byeong-Kwon Ju, Seoul (KR); Hee-Tae Kim, Seosan-Si (KR)

(73) Assignees: Samsung Electronics Co., Ltd., Suwon-si (KR); Korea University Industrial and Academic Collaboration Foundation, Seoul (KR)

( * ) Notice: Subject to any disclaimer, the term of this patent is extended or adjusted under 35 U.S.C. 154(b) by 0 days.

(21) Appl. No.: 12/357,681

(22) Filed: Jan. 22, 2009

(65) Prior Publication Data
US 2009/0184783 A1    Jul. 23, 2009

(30) Foreign Application Priority Data
Jan. 23, 2008   (KR) .................. 10-2008-0007186

(51) Int. Cl.
*H01L 29/06* (2006.01)
(52) U.S. Cl. .......... 257/24; 438/411; 977/936; 977/937; 977/938; 257/E21.404

(58) Field of Classification Search ................ 257/9, 24, 257/288, 347, E29.327, E39.013, E29.322, 257/E49.003, E21.404, E21.408; 438/49, 438/411, 412, 421; 977/936–938
See application file for complete search history.

(56) References Cited

U.S. PATENT DOCUMENTS

| | | | |
|---|---|---|---|
| 7,254,151 B2* | 8/2007 | Lieber et al. ............... | 372/44.01 |
| 7,579,618 B2* | 8/2009 | Adam ............... | 257/25 |
| 2004/0152272 A1* | 8/2004 | Fladre et al. ............... | 438/284 |
| 2005/0034529 A1* | 2/2005 | Tang et al. ............... | 73/777 |
| 2005/0212014 A1* | 9/2005 | Horibe et al. ............... | 257/213 |
| 2007/0105321 A1* | 5/2007 | Lee et al. ............... | 438/270 |
| 2007/0155025 A1* | 7/2007 | Zhang et al. ............... | 438/3 |
| 2010/0171569 A1* | 7/2010 | Ionescu et al. ............... | 333/185 |

OTHER PUBLICATIONS

Cui et al. ("High Performance Silicon Nanowire Field Effect Transistors", Nano Letters, 2003, vol. 3, No. 2, 149-152).*

(Continued)

*Primary Examiner* — William F Kraig
(74) *Attorney, Agent, or Firm* — NSIP Law

(57) ABSTRACT

A resonant structure is provided, including a first terminal, a second terminal which faces the first terminal, a wire unit which connects the first terminal and the second terminal, a third terminal which is spaced apart at a certain distance from the wire unit and which resonates the wire unit, and a potential barrier unit which is formed on the wire unit and which provides a negative resistance component. Accordingly, transduction efficiency can be enhanced.

11 Claims, 7 Drawing Sheets

OTHER PUBLICATIONS

Bjork et al. ("Few-Electron Quantum Dots in Nanowires", Nano Letters. 2004, vol. 4, No. 9, 1621-1625).*

Wu et al. ("Block-by-Block Growth of Single-Crystalline Si/SiGe Superlattice Nanowires", Nano Letters, 2002, vol. 2, No. 2, 83-86).*

Midtvedt et al. ("Parametric Resonance in Nanoelectromechanical Single Electron Transistors". Nano Lett., 2011, 11 (4) pp. 1439-1442. Mar. 4, 2011.).*

Lauhon et al. ("Semiconductor Nanowire Heterostructures", Phil. Trans. R. Soc. Lond. A (2004) 362, 1247-1260. Apr. 8, 2004.).*

Thelander et al. ("Single-electron Transistors in Heterostructure Nanowires", Applied Phys. Lett., vol. 83 (10), 2052-2054, Sep. 8, 2003).*

Postma et al. ("Carbon Nanotube Single-electron Transistors at Room Temperature", Science, vol. 293, pp. 76-79, Jul. 6, 2001).*

* cited by examiner

RESONANT STRUCTURE COMPRISING WIRE AND RESONANT TUNNELING TRANSISTOR

CROSS-REFERENCE TO RELATED APPLICATIONS

This application claims the benefit under 35 U.S.C. §119 (a) of Korean Patent Application No. 10-2008-0007186, filed on Jan. 23, 2008, in the Korean Intellectual Property Office, the entire disclosures of both of which are hereby incorporated by reference.

BACKGROUND OF THE INVENTION

1. Field of the Invention

The present invention relates to a resonant structure comprising a wire, a resonant tunneling transistor, and a method for fabricating the resonant structure. More particularly, the present invention relates to a resonant structure which provides a greater oscillation, a resonant tunneling transistor, and a method for fabricating the resonant structure.

2. Description of the Related Art

Due to the development of electronic technology, diverse types of microminiaturized portable devices have become widely used. Such microminiaturized portable devices require microminiaturized components.

In order to implement microminiaturized and ultra-light components, Micro Electro-Mechanical Systems (MEMS), which include mechanical or electromechanical devices having a microminiaturized structure which can be measured in micrometers, or Nano Electro-Mechanical Systems (NEMS), which include mechanical or electromechanical devices having a microminiaturized structure which can be measured in nanometers, have become increasingly used. NEMS are electromechanical systems which may be one hundred-thousandth the size of a human hair, which transform an electric signal into a mechanical movement, or inversely a mechanical movement into an electric signal.

A microminiaturized resonator using MEMS or NEMS technology can be used as a component of a filter or a duplexer in portable communication devices for radio frequency (RF) communication.

A conventional MEMS resonator needs a high force constant in order to generate RF signals of over 1 gigahertz, and has difficulty in tuning.

A conventional NEMS resonator has low oscillation, so only electric signals of low size are output. Accordingly, additional devices such as amplifiers have to be used along with the conventional NEMS resonator. In addition, the conventional NEMS resonator also has difficulty in tuning.

SUMMARY OF THE INVENTION

An aspect of embodiments of the present invention is to solve at least the above problems and/or disadvantages and to provide at least the advantages described below. Accordingly, an aspect of embodiments of the present invention is to provide a microminiaturized resonant structure which provides a higher output property, a resonant tunneling transistor, and a method for fabricating the resonant structure.

Another aspect of embodiments of the present invention is to provide a microminiaturized resonant structure which provides a higher output property and is easy for tuning, a resonant tunneling transistor, and a method for fabricating the resonant structure.

In order to achieve the above-described and other aspects of embodiments of the present invention, a resonant structure is provided including a first terminal, a second terminal which faces the first terminal, a wire unit which connects the first terminal and the second terminal, a third terminal which is spaced a part at a certain distance from the wire unit, and which resonates the wire unit, and a potential barrier unit which is formed on the wire unit and which provides a negative resistance component.

The potential barrier unit may include a plurality of potential barriers which are formed on the wire unit to be spaced apart from each other.

The wire unit may be a nano-wire having a section with a circular or polygonal shape.

The wire unit may be formed of silicon (Si), and wherein the potential barrier unit may include a plurality of potential barriers which are formed of silicon-germanium (SiGe), and a well area which is formed between the plurality of potential barriers.

The resonant structure may further include a magnetic field generation unit which generates a magnetic field around the wire unit.

The resonant structure may further include a magnetic substance which is formed on part of the wire unit, and which displaces the wire unit reacting to the magnetic field.

In order to achieve the above-described and other aspects of embodiments of the present invention, a resonant tunneling transistor is provided, including a drain part, a source part which faces the drain part, a wire unit which connects the drain part and the source part, a gate part which is spaced apart at a certain distance from the wire unit, and which generates resonant tunneling between the drain part and the source part by resonating the wire unit, and a potential barrier unit which increases an electric current flowing between the drain part and the source part by providing a negative resistance component when the resonant tunneling is generated.

The wire unit may be formed of Si, and wherein the potential barrier unit may includes a plurality of potential barriers which may be formed of SiGe, and a well area which is formed between the plurality of potential barriers.

The resonant tunneling transistor may further include a magnetic field generation unit which generates a magnetic field around the wire unit, and a magnetic substance which is formed on part of the wire unit, and displaces the wire unit reacting to the magnetic field.

In order to achieve the above-described and other aspects of embodiments of the present invention, a method for fabricating a resonant structure is provided, including forming a plurality of potential barriers by doping a surface of a plurality of semiconductor layers which are sequentially disposed, forming a plurality of terminals which face each other by doping an area of the first surface wherein the plurality of potential barriers are formed between the plurality of terminals, forming a wire unit including the plurality of potential barriers by patterning an area where the plurality of terminals are not formed, and ensuring a space for resonating the wire unit by etching the semiconductor layer under the wire unit.

The step of etching the semiconductor layer under the wire unit may include forming a terminal which is spaced apart at a certain distance from the wire unit by etching the semiconductor layer which contacts the wire unit from among the plurality of semiconductor layer.

The method may further include forming a magnetic field generation unit on one side of the wire unit.

The method may further include coating a magnetic substance on part of the wire unit.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF EMBODIMENTS OF THE PRESENT INVENTION

Figure 1:
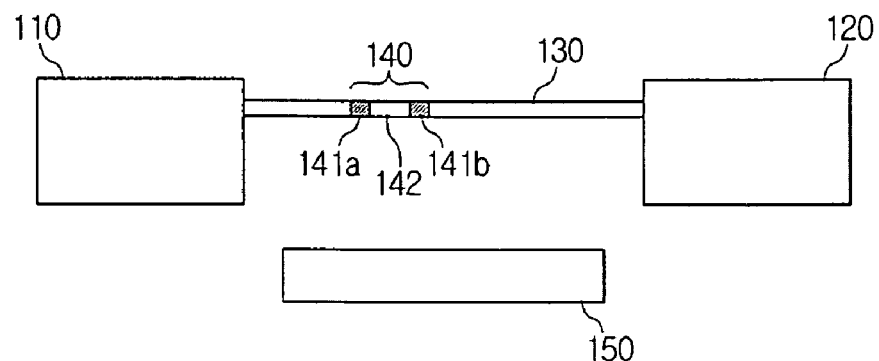
FIG. 1 is a mimetic diagram illustrating a resonant structure according to an embodiment of the present invention.

Reference will now be made in detail to the present embodiments of the present invention, examples of which are illustrated in the accompanying drawings, wherein like reference numerals refer to like elements throughout. The embodiments are described below in order to explain the present invention by referring to the figures.

FIG. 1 is a mimetic diagram illustrating a resonant structure according to an embodiment of the present invention. As shown in FIG. 1, the resonant structure includes a plurality of terminals 110, 120 and 150, a wire unit 130, and a potential barrier unit 140.

Among the plurality of terminals 110, 120 and 150, a first and second terminal 110 and 120 are spaced apart to face each other. One of the first and second terminal 110 and 120 may be connected to a bias power, and the other may be connected to a ground power. For convenience of description, it is assumed that the first terminal 110 is connected to a bias power hereinafter).

The wire unit 130 is formed between the first terminal 110 and the second terminal 120. The wire unit 130 may be implemented as a wire which directly connects the first terminal 110 to the second terminal 120, in particular, as a nano-wire having a thickness and a length of the nanometer unit. A section of the wire unit 130 may have a circular shape or a polygonal shape such as a quadrangle.

The third terminal 150 is disposed at one side of the wire unit 130. The third terminal 150 and the wire unit 130 are spaced apart at a certain distance, so a space for oscillating the wire unit 130 is ensured. If an external control power (not shown) is provided, the third terminal 150 biases the wire unit 130, so resonance occurs.

The potential barrier unit 140 is formed on the wire unit 130, and includes a plurality of potential barriers 141a and 141b, and a well area 142 which is formed between the potential barriers 141a and 141b.

The potential barrier unit 140 forms a potential well in an energy band gap when the wire unit 130 is resonated. The potential well facilitates resonant tunneling between the first terminal 110 and the second terminal 120. That is, the potential barrier unit 140 provides a negative resistance component while the wire unit 130 is resonated, so the current flowing between the first terminal 110 and the second terminal 120 sharply increases. As a result, since the transduction efficiency which detects electric signals from oscillation is improved, the problem that a conventional NEMS resonator provides a low output property resulting from low oscillation can be solved. The operation of the potential barrier unit 140 will be described in greater detail below.

Figure 2:
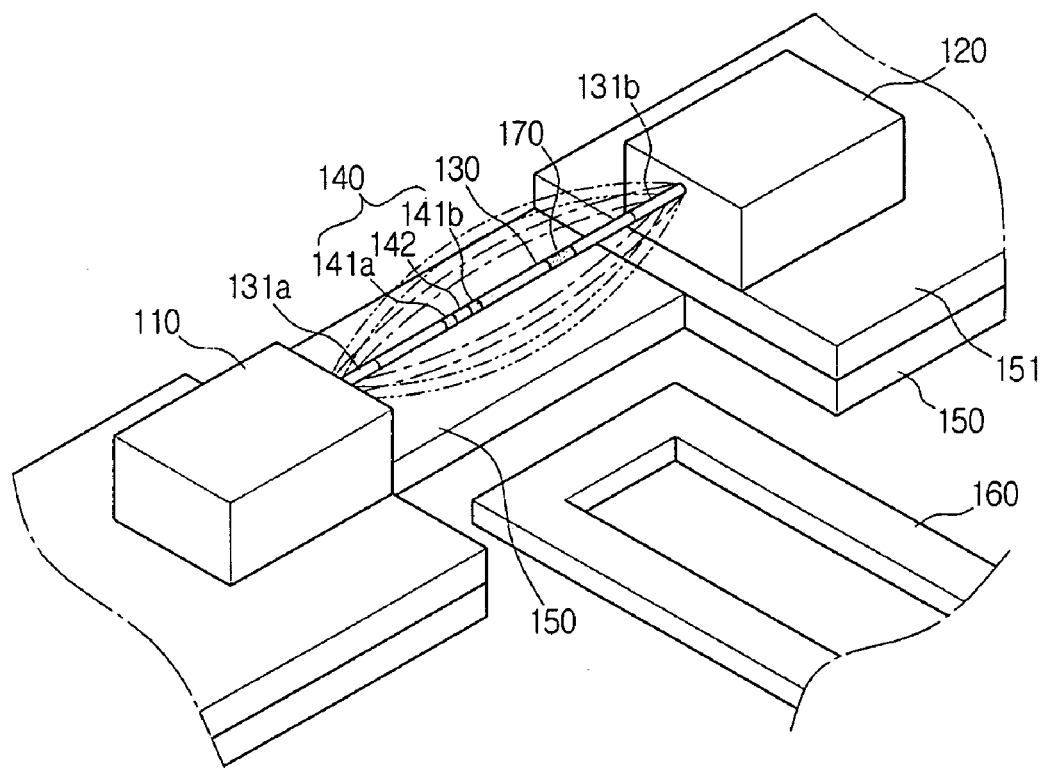
FIG. 2 is a mimetic diagram illustrating a resonant tunneling transistor according to an embodiment of the present invention.

FIG. 2 illustrates a resonant structure according to another embodiment of the present invention. In this embodiment, in addition to the resonant structure of FIG. 1, a magnetic field generation unit 160 is added to one side of the third terminal 150, and a magnetic substance 170 is added to the wire unit 130.

The resonant structure may be used as a resonant tunneling transistor. In this case, the first terminal 110 may be a drain part, the second terminal 120 may be a source part, and the first terminal 150 may be a gate part. In FIG. 2, the resonant structure which is used as a resonant tunneling transistor is described as an example.

The gate part 150 supports the drain part 110 and the source part 120. More specifically, a support layer 151 is disposed to be spaced apart on the gate part 150, and the drain part 110 and the source part 120 are formed on each of the support layer 151.

The wire unit 130 which connects the drain part 110 and the source part 120 is formed on the gate part 150. As shown in FIG. 2, the wire unit 130 is formed to be spaced apart from the gate part 150 by completely removing the support layer 151. Alternatively, if a space for oscillating the wire unit 130 can be ensured, it is also possible to form the wire unit 130 by etching a part of the support layer 151 in order for the support layer 151 not to contact the wire unit 130 instead of completely removing the support layer 151. In addition, the support layer 151 is disposed to form a space between the wire unit 130 and the gate part 150, so if the drain part 110 and the source part 120 have an appropriate thickness, the support layer 151 can be omitted.

If the wire unit 130 is formed of silicon (Si) as an example in FIG. 2, the entire wire unit 130 consists of a silicon area, a first potential barrier 141a, a silicon area 142, a second potential barrier 141b, a silicon area, a magnetic substance 170, and a silicon area, in sequence. The first potential barrier 141a and the second potential barrier 141b are formed of silicon-germanium (SiGe).

The silicon area 142 between the first potential barrier 141a and the second potential barrier 141b operates as a well area, so the silicon area 142 forms the potential barrier unit 140 together with the first potential barrier 141a and the second potential barrier 141b. $n^+$ silicon connection units 131a and 131b may be formed at both ends of the wire unit 130 to be connected to the drain part 110 and the source part 120, respectively.

If the wire unit 130 has the structure of FIG. 2, when a particular drain bias is provided to the drain part 110, a chemical potential of the source part 120 forms a potential well by being arranged with a quantum energy level of the well area 142 in the potential barrier unit 140 on an energy band gap. A negative resistance caused by the potential well, that is, a negative differential resistance (NDR) is formed. In this case, a sharply current increase/decrease occurs in the NDR peak.

Since the wire unit 130 is formed to float in the air, the wire unit 130 is oscillated according to the natural frequency, so the capacity of electrostatic coupling between the gate part 150 and the well area 142 changes, so the location of the NDR peak changes. Therefore, if the bias condition is adapted to area around the NDR peak by adjusting the voltage applied to the gate part 150 and the bias power applied to the drain part 110, the oscillation of the wire unit 140 increases. As a result, a high output of electric current can be obtained. Therefore, a resonant structure having a high output property without a separate amplifier can be implemented.

When the wire unit 130 is located above a wide plate such as the gate part 150 as shown in FIG. 2, the gate electrostatic capacity and the quantity of location change are expressed according to the following mathematical function.

$$C_G = \frac{4\pi\varepsilon_0 L}{2\ln(2z/r)}$$ [Mathematical function 1]

$$\frac{\delta z}{z} = \frac{\delta C_G}{C_G}\ln(2z/r)$$

In Mathematical function 1, $C_G$ indicates a gate electrostatic capacity, Z indicates the quantity of the change of the wire unit 130, L indicates the length of the wire unit 130, and r indicates a distance between the wire unit 130 and the gate part 150.

The change of the gate voltage applied to the gate part 150 and the change of the magnetic field generated by the magnetic field generation unit 160 commonly affect the wire unit 130, so the oscillation displacement $\delta z$ and the resultant change of electrostatic capacity $\delta C_G$ occur as shown in Mathematical function 1. Consequently, the oscillation of the wire unit 130 can be adjusted.

In the exemplary embodiment of FIG. 2, the magnetic field generation unit 160 and the magnetic substance 170 have been added. The magnetic field generation unit 160 may be implemented as an electromagnet which generates a magnetic field around the wire unit 130.

If the electricity is applied to the magnetic field generation unit 160, a magnetic field is generated. The magnetic field gives the action or repulsion to the magnetic substance 170 on the wire unit 130.

The magnetic substance 170 on the wire unit 130 reacts to the magnetic field, so the wire unit 130 is displaced. As a result, the wire unit 130 which is being oscillated according to the natural frequency changes to have a higher frequency width due to interaction between the magnetic substance 170 and the magnetic field generation unit 160, so frequency tuning is performed. The resonant structure according to an embodiment of the present invention generates a magnetic field around the wire unit 130, so the natural frequency of the wire unit 130 can be tuned simply and efficiently. Therefore, the resonant structure according to an embodiment of the present invention has tuning higher than a conventional MEMS resonator or a conventional NEMS resonator, and so can be applied to a tunable RF system. The resonant structure of FIG. 2 can be implemented using the any of the MEMS and NEMS technology.

Figure 3:
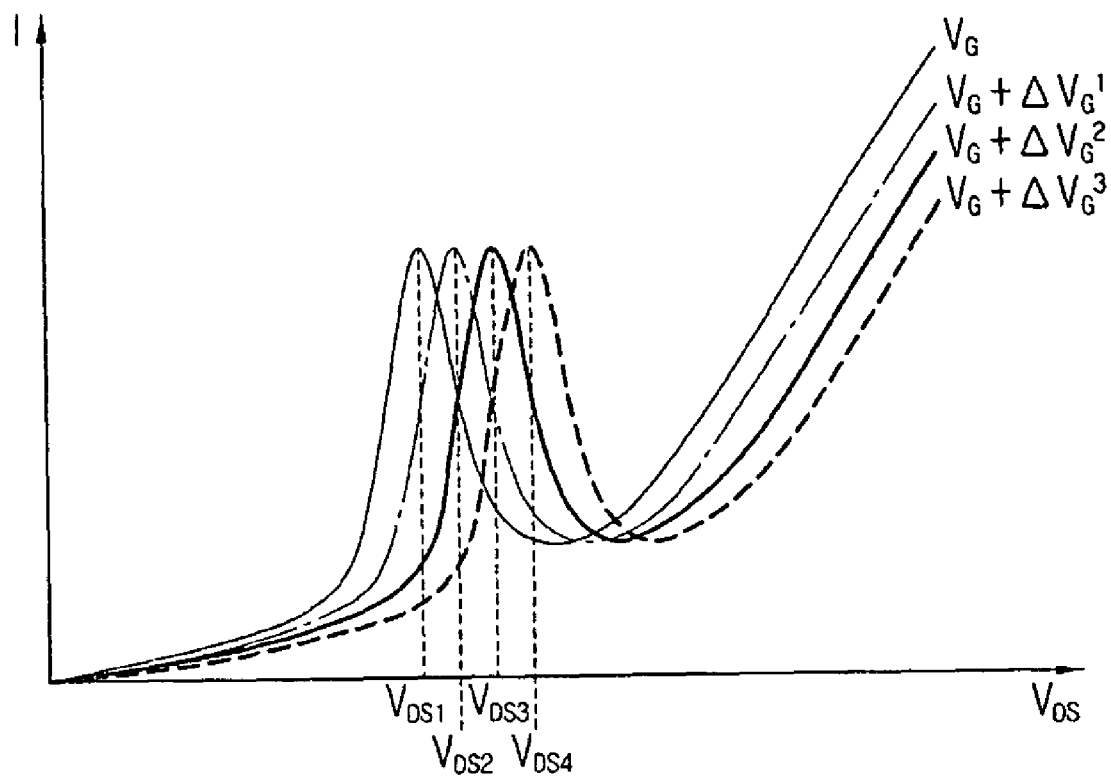
FIG. 3 is a graph illustrating features of an electric current of a resonant structure.

FIG. 3 is a graph illustrating $V_{DS}$-I feature of a resonant structure or a resonant tunneling transistor according to an embodiment of the present invention.

Referring to FIG. 3, the current I changes according to the voltage $V_{DS}$ between the drain part 110 and the source part 120. The current I increases sharply and peaks at a particular voltage $V_{DS}$, decreases, and gradually increases again.

If the potential of the well area 142 changes by changing the gate voltage $V_G$ applied to the gate part 150, the quantum energy level changes, so the location of the drain bias where the NDR peak occurs changes. Therefore, when a particular gate voltage is fixed at the voltage $V_G$, the output current I can peak by adjusting $V_{DS}$ to $V_{DS1}$.

Furthermore, as the gate voltage $V_G$ applied to the gate part 150 changes to $V_G + \Delta V_G^1$, $V_G + \Delta V_G^2$, or $V_G + \Delta V_G^3$, the waveform of the output current I changes. Accordingly, if the current bias voltage $V_{DS}$ is fixed at $V_{DS3}$, the output current I can peak by adjusting the gate voltage $V_G$ to $V_G + \Delta V_G^2$.

The features of the current and voltage of the resonant tunneling transistor can be expressed according to the following mathematical function of the drain voltage $V_{DS}$ and the gate electric charge $Q_G$.

$$I_{DS} = I_{DS}(V_{DS}, Q_G)$$ [Mathematical function 2]

In Mathematical function 2, $Q_G$ indicates $C_G V_G$, $C_G$ indicates the gate electrostatic capacity, and $V_G$ indicates the gate voltage.

The quantity of the change of the output current $I_{DS}$ can be expressed according to the following mathematical function $$\delta I_{DS} = \frac{\partial I_{DS}}{\partial V_{DS}}\delta V_{DS} + \frac{\partial I_{DS}}{\partial Q_G}\delta Q_G$$ [Mathematical function 3]

$$= \frac{\partial I_{DS}}{\partial V_{DS}}\delta V_{DS} + \frac{\partial I_{DS}}{\partial Q_G}(C_G \delta V_G + V_G \delta C_G)$$

In Mathematical function 3, $\delta V_G$ indicates the input RF or MW signal, $\delta I_{DS}$ indicates the output RF or MW signal, and $\delta V_{DS}$ indicates another output RF or MW) signal for frequency mixing. Comparing a general resonant structure having a semiconductor wire which is similar to FIG. 2 with the resonant structure of FIG. 2 having the potential barrier unit 140, the change $\delta C_G$ of the gate electrostatic capacity due to mechanical resonance in the resonant structure of FIG. 2 has the same value. However, as shown in FIG. 3, since the value $\partial I_{DS}/\partial Q_G$ of the resonant structure of FIG. 2 is higher than that of the general resonant structure, the entire output signal becomes higher.

FIGS. 4A to 4F illustrate a method for fabricating a resonant structure according to an embodiment of the present invention, and FIGS. 5A to 5F are vertically-sectioned view corresponding to FIGS. 4A to 4F.

Figure 4A:
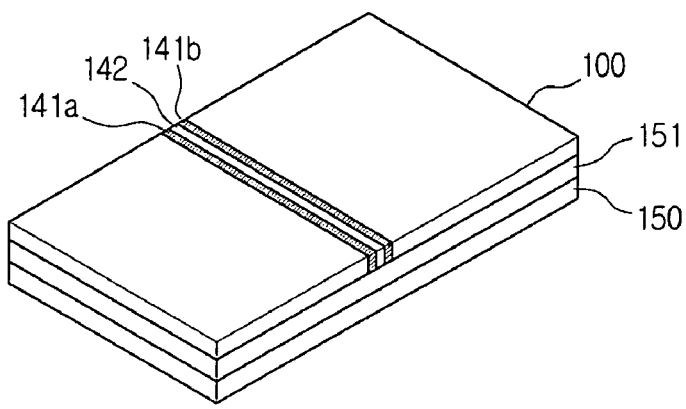
FIGS. 4A to 4F illustrate a method for fabricating a resonant structure according to an embodiment of the present invention.
Figure 5A:
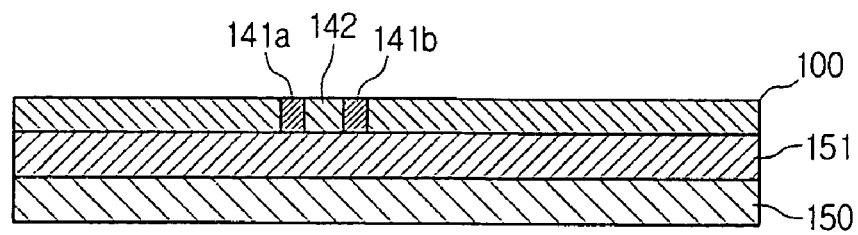
FIGS. 5A to 5F are vertically-sectioned view corresponding to FIGS. 4A to 4F.

Referring to FIGS. 4A and 5A, a plurality of semiconductor layers are sequentially disposed. From the top, a first layer 100, a support layer 151, and a second layer 150 are disposed. The first layer 100 forms a first terminal 110, a second terminal 120, and a wire unit 130. The second layer 150 forms a third terminal 150 by patterning process.

Subsequently, doping is performed on one surface of the plurality of semiconductor layers. In more detail, a plurality of potential barriers 141a and 141b are formed by doping one surface of the first layer 100. The first layer 100 is formed of a silicon, and the potential barriers 141a and 141b are doped with SiGe. A silicon area between the potential barriers 141a and 141b forms a well area 142.

Figure 4B:
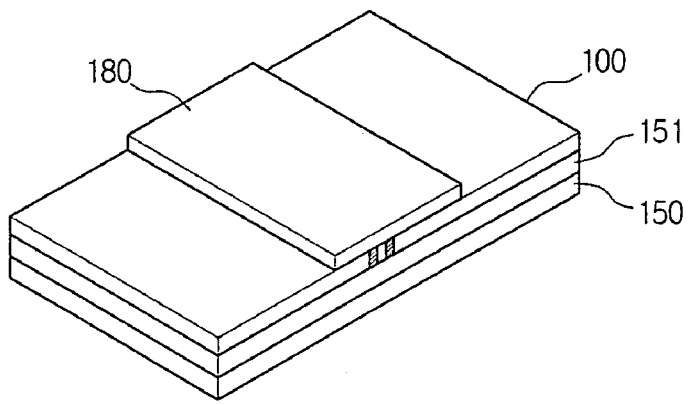
Figure 5B:
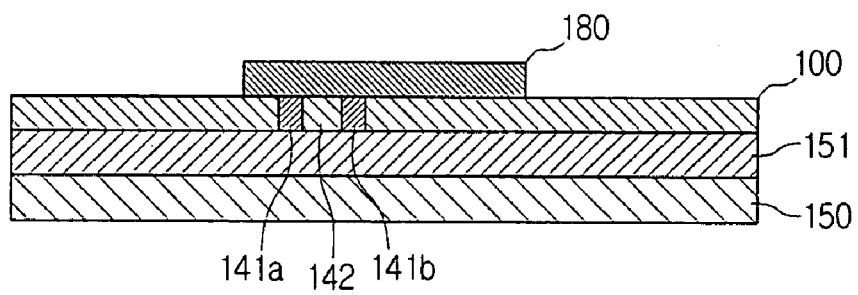

Next, as shown in FIGS. 4B and 5B, a mask layer 180 is formed on the first layer 100 by lithography process. The mask layer 180 is formed on the surface of the first layer 100 excluding the first terminal 110 and the second terminal 120.

Figure 4C:
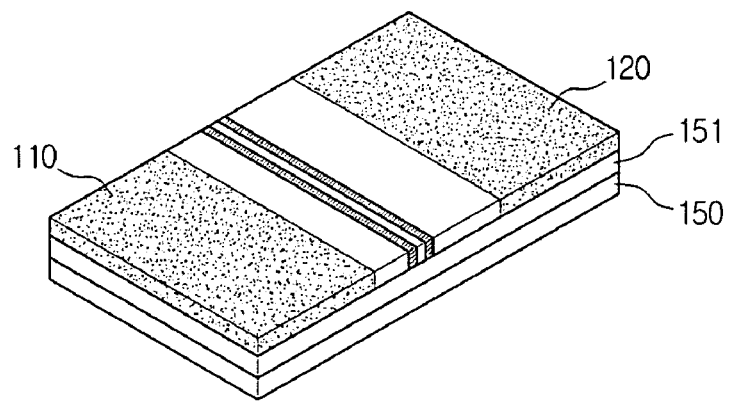
Figure 5C:
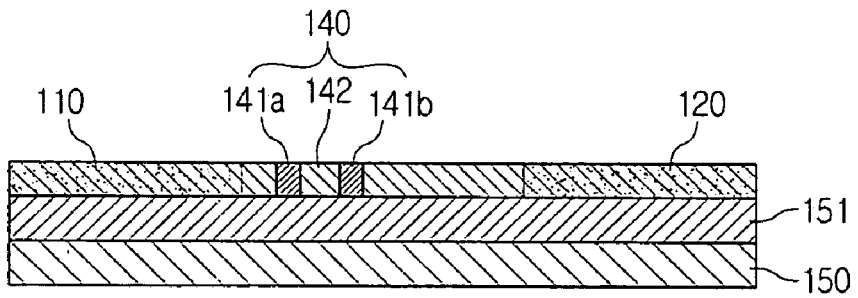

Subsequently, as shown in FIGS. 4C and 5C, doping is performed using n+. Only part of the first layer 100 on which the mask layer 180 is not formed is doped, so the first terminal 110 and the second terminal 120 are symmetrically formed.

Figure 4D:
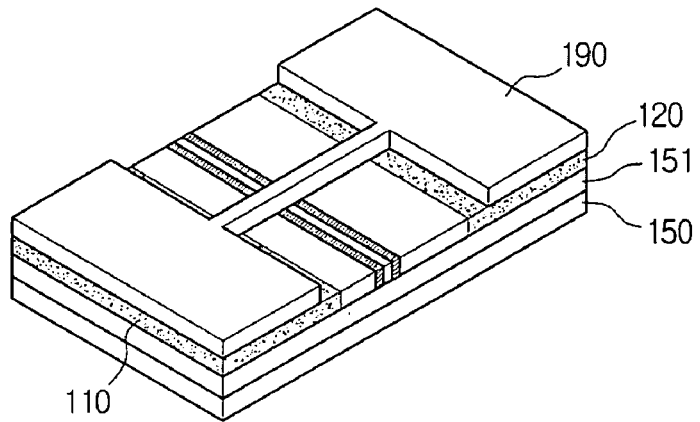
Figure 5D:
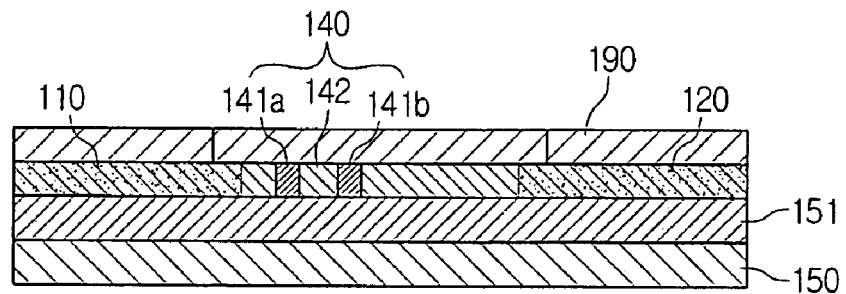

Then, as shown in FIGS. 4D and 5D, a mask layer 190 is formed to cover the first terminal 110 and the second terminal 120 by lithography process. In this case, the mask layer 190 is formed to have a pattern corresponding to the wire unit 130 between the mask layer 190 covering the first terminal 110 and the mask layer 190 covering the second terminal 120.

Figure 4E:
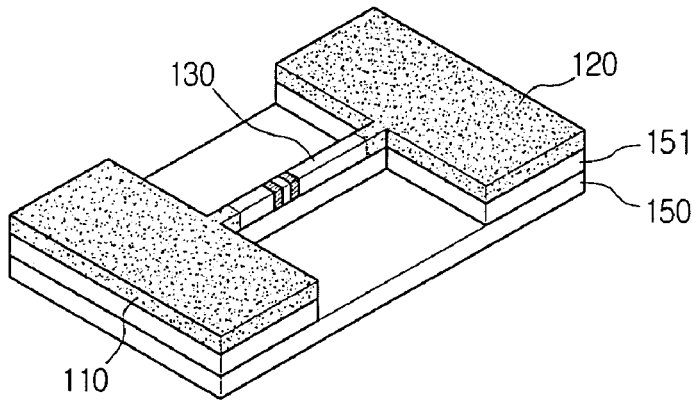
Figure 5E:
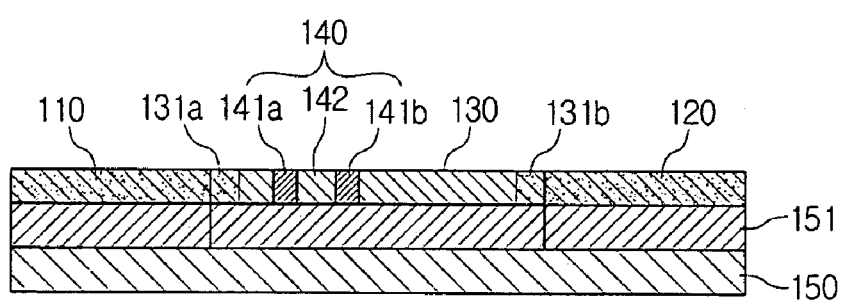

Subsequently, as shown in FIGS. 4E and 5E, a pattern of the wire unit 130 including the plurality of potential barriers 141a and 141b is formed by performing etching process using the mask layer 190. During this process, part of the support layer 151 which is not covered by the first terminal 110, the second terminal 120, and the pattern of the wire unit 130 is also etched, so the third terminal 150 is exposed upwards.

In the process of FIGS. 4D and 5D, the first terminal 110 and the second terminal 120 may partially be exposed towards the wire unit 130 instead of being completely covered by the mask layer 190. In this case, if the etching process is performed as shown in FIGS. 4E and 5E, both ends of the pattern of the wire unit 130 are formed of the same material as the first terminal 110 and the second terminal 120. That is, $n^+$ silicon connection units 131a and 131b are formed at both ends of the pattern of the wire unit 130.

Figure 4F:
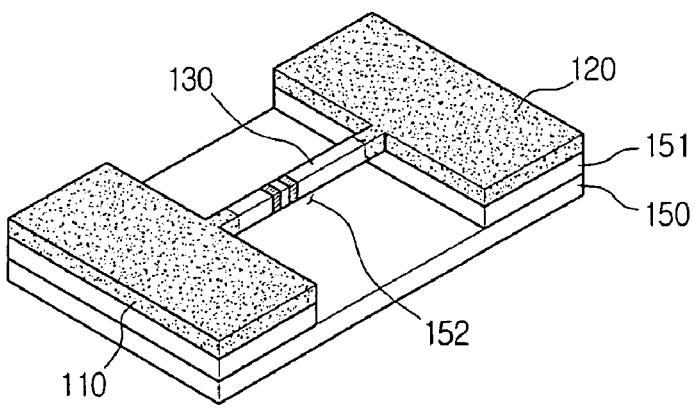
Figure 5F:
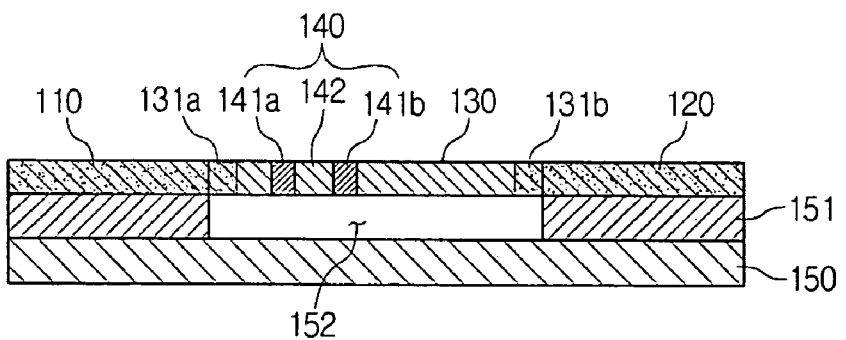

Subsequently, as shown in FIGS. 4F and 5F, the support layer 151 under the wire unit 130 is etched, so the wire unit 130 is spaced apart from the third terminal 150. Consequently, a space 152 for oscillating the wire unit 130 can be ensured.

Following this method for fabricating a resonant structure, the magnetic field generation unit 160 and the magnetic substance 170 as shown in FIG. 2 can also be formed. In the process of FIGS. 4E and 5E, the third terminal 150 can be divided in two by etching part of the third terminal 150. One of them can function as the magnetic field generation unit 160. Alternatively, after completing the process of FIGS. 4F and 5F, the magnetic field generation unit 160 can separately be formed on one side of the wire unit 130.

In addition, the magnetic substance 170 can be formed by coating part of the first layer 100 with a magnetic material during the process of FIGS. 4A and 5A, or can also be formed by doping process.

In the resonant structure fabricated in the method for fabricating a resonant structure as shown in FIGS. 4A to 4F and FIGS. 5A to 5F, the wire unit 130 has the same thickness as the first terminal 110 and the second terminal 120. However, in embodiments as shown in FIGS. 1 and 2, the wire unit 130 has the thickness thinner than the first terminal 110 and the second terminal 120. This is the structural difference due to those embodiments.

For example, during the etching process of FIGS. 4F and 5F, if a lower part of the wire unit 130 is etched with the support layer 151, the wire unit 130 can be formed thinly as shown in FIGS. 1 and 2. Alternatively, in the process of disposing the plurality of semiconductor layers, the wire unit 130 can be formed thinner than the first terminal 110 and the second terminal 120 by disposing a sacrifice layer under an area where the wire unit 130 is formed and etching the sacrifice layer later.

The lithography process and etching process used in this method for fabricating a resonant structure are conventionally used processes.

Figure 6:
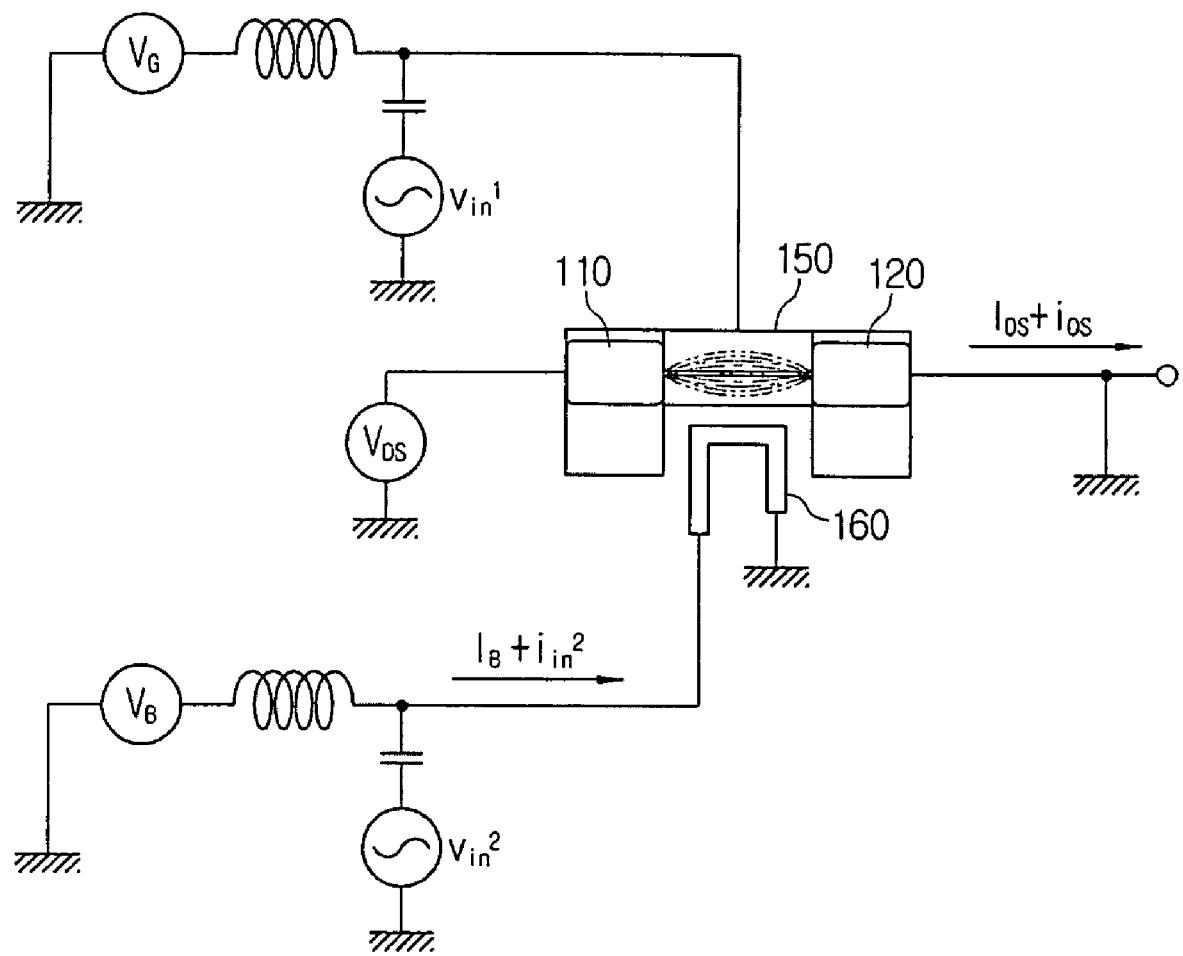
FIG. 6 is a circuit diagram illustrating a circuit using a resonant tunneling transistor according to an embodiment of the present invention.

FIG. 6 is a circuit diagram illustrating a circuit using a resonant tunneling transistor according to an embodiment of the present invention.

Referring to FIG. 6, a drain part 110 is connected to a power $V_{DS}$, and a gate part 150 is connected to powers $V_G$ and $V_{in1}$ together with an inductor and a capacitor. The source part 120 is connected to an output terminal and a grounding terminal. First end of the magnetic field generation unit 160 is connected to the direct current (DC) power $V_B$ and $V_{in2}$. Accordingly, $I_{DS}+i_{DS}$ is output by the resonant transistor. Since the frequency of the output current $i_{DS}$ can be tuned diversely using multiple RF inputs $V_{in1}$ and $V_{in2}$, diverse output current $I_{DS}+i_{DS}$ can be obtained.

As can be appreciated from the above description, such a resonant structure or a resonant tunneling transistor which is implemented using the resonant structure can be applied to high-speed digital integrated circuits (ICs), such as a D-flip flop, a frequency divider, or a multiplexer.

Moreover, such a resonant structure and such a resonant tunneling transistor can be applied to MEMS components or NEMS components which need to transform mechanical signals into electric signals. In particular, such a resonant structure and such a resonant tunneling transistor can be applied to RF systems such as RF filters, frequency combiners, or frequency generators since an RF MEMS which operates in a high frequency requires a high trans-efficiency. In addition, such a resonant structure and such a resonant tunneling transistor can be microminiaturized and increase the output current, and so can be applied to diverse low-power communication systems which will be developed in the future. Furthermore, tuning can be easily performed.

While the invention has been shown and described with reference to certain embodiments thereof, it will be understood by those skilled in the art that various changes in form and details may be made therein without departing from the spirit and scope of the invention as defined by the appended claims.

What is claimed is:

1. A resonant structure, comprising:
   a first terminal;
   a second terminal which faces the first terminal;
   a wire unit which connects the first terminal and the second terminal;
   a third terminal which is spaced apart at a certain distance from the wire unit, and which physically resonates the wire unit; and
   a potential barrier unit which is formed on the wire unit and which provides a negative resistance component, wherein the potential barrier unit forms a potential well in an energy band gap in response to the wire unit being physically resonated.

2. The resonant structure of claim 1, wherein the potential barrier unit comprises a plurality of potential barriers, the potential barriers being formed on the wire unit to be spaced apart from each other.

3. The resonant structure of claim 1, wherein the wire unit is a nano-wire having a section with a circular or polygonal shape.

4. The resonant structure of claim 1, wherein the wire unit is formed of silicon (Si), and
   wherein the potential barrier unit comprises:
      a plurality of potential barriers formed of silicon-germanium (SiGe); and
      a well area which is formed between the potential barriers.

5. The resonant structure of claim 1, further comprising a magnetic field generation unit which generates a magnetic field around the wire unit.

6. The resonant structure of claim 5, further comprising a magnetic substance which is formed on part of the wire unit, and which displaces the wire unit reacting to the magnetic field.

7. The resonant structure of claim 1, wherein one end of the wire unit includes a doped $N^+$ silicon connection unit connecting the one end of the wire unit to one of the first and second terminals.

8. A resonant tunneling transistor, comprising:
a drain part;
a source part which faces the drain part;
a wire unit which connects the drain part and the source part;
a gate part which is spaced apart at a certain distance from the wire unit, and which generates resonant tunneling between the drain part and the source part by physically resonating the wire unit; and
a potential barrier unit which increases an electric current flowing between the drain part and the source part by providing a negative resistance component when the resonant tunneling is generated, wherein the potential barrier unit forms a potential well in an energy band gap in response to the wire unit being physically resonated.

9. The resonant tunneling transistor of claim 8, wherein the wire unit is formed of Si, and wherein the potential barrier unit comprises:
a plurality of potential barriers formed of SiGe; and
a well area formed between the potential barriers.

10. The resonant tunneling transistor of claim 8, further comprising:
a magnetic field generation unit which generates a magnetic field around the wire unit; and
a magnetic substance which is formed on part of the wire unit, and displaces the wire unit reacting to the magnetic field.

11. The resonant tunneling transistor of claim 8, wherein one end of the wire unit includes a doped $N^+$ silicon connection unit connecting the one end of the wire unit to one of the drain part and the source part.

* * * * *